United States Patent [19]
Nowak

[11] Patent Number: 5,400,277
[45] Date of Patent: Mar. 21, 1995

[54] SEMICONDUCTOR ON INSULATOR STATIC RANDOM ACCESS MEORY CELL UTILIZING POLYSILICON RESISTORS FORMED IN TRENCHES

[75] Inventor: Edward D. Nowak, Pleasanton, Calif.

[73] Assignee: VLSI Technology, Inc., San Jose, Calif.

[21] Appl. No.: 145,450

[22] Filed: Oct. 29, 1993

[51] Int. Cl.[6] .............................................. G11C 14/00
[52] U.S. Cl. .................... 365/154; 257/347; 257/349; 257/350; 257/358; 257/359; 257/379; 257/380; 257/903
[58] Field of Search ............... 257/347, 349, 350, 358, 257/359, 372, 379, 380, 903, 904; 365/154, 176

[56] References Cited

U.S. PATENT DOCUMENTS 4,933,739  6/1990  Harris .................................. 257/380

OTHER PUBLICATIONS

T. Ohzone, T. Hirao, K. Tsuji, S. Horiuchi, and S. Takayanagi, *A 2K×8-Bit Static MOS RAM with a New Memory Cell Structure*, IEEE J. Solid-State Circuits, vol. SC-15, Apr. 1980, pp. 201-205.

Laura Peters, *SOI Takes Over Where Silicon Leaves Off*, Semiconductor International, Mar. 1993, pp. 48-51.

H. H. Hosack, *Recent Progress in SOI Materials For the Next Generation of IC Technology*, The Electrochemical Society Interface, Spring 1993, pp. 51-57.

*Primary Examiner*—Eugene R. LaRoche
*Assistant Examiner*—F. Niranjan
*Attorney, Agent, or Firm*—Douglas L. Weller

[57] ABSTRACT

A resistor is connected to the source/drain of a transistor and used as a load element of a memory cell. A trench is formed which extends from a top of the wafer through an isolation region of the wafer to a silicon base of the wafer. The silicon base of the wafer is located below the isolation region of the wafer. A resistive layer of material is formed in the trench. The resistive layer extends from the top of the wafer through the isolation region of the wafer and is electrically connected to the silicon base of the wafer. The resistor is connected to other circuitry on the wafer, for example, by implanting into the wafer atoms of a first conductivity type into a region immediately adjacent to the resistive layer of material in the trench. In the preferred embodiment, the resistive layer of material is deposited polysilicon.

6 Claims, 6 Drawing Sheets

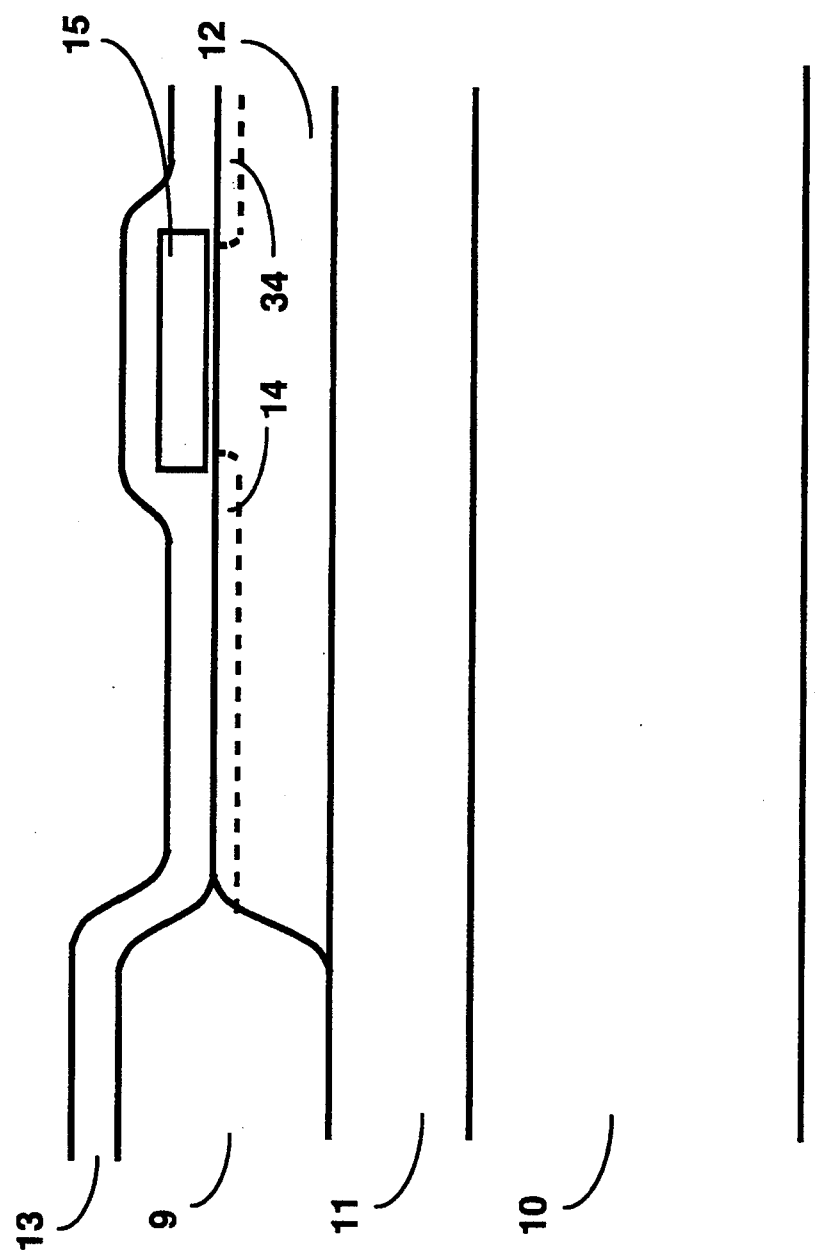

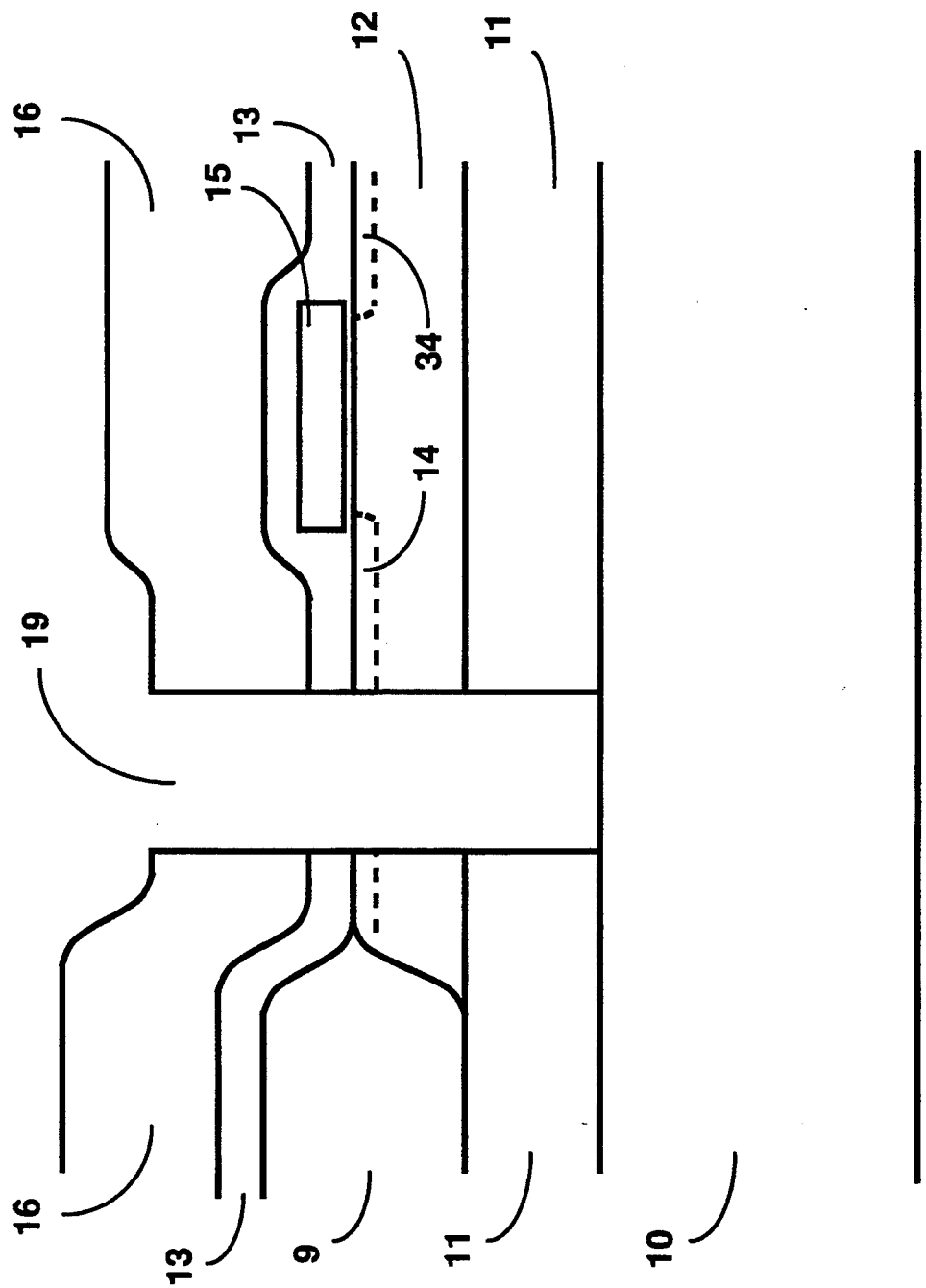

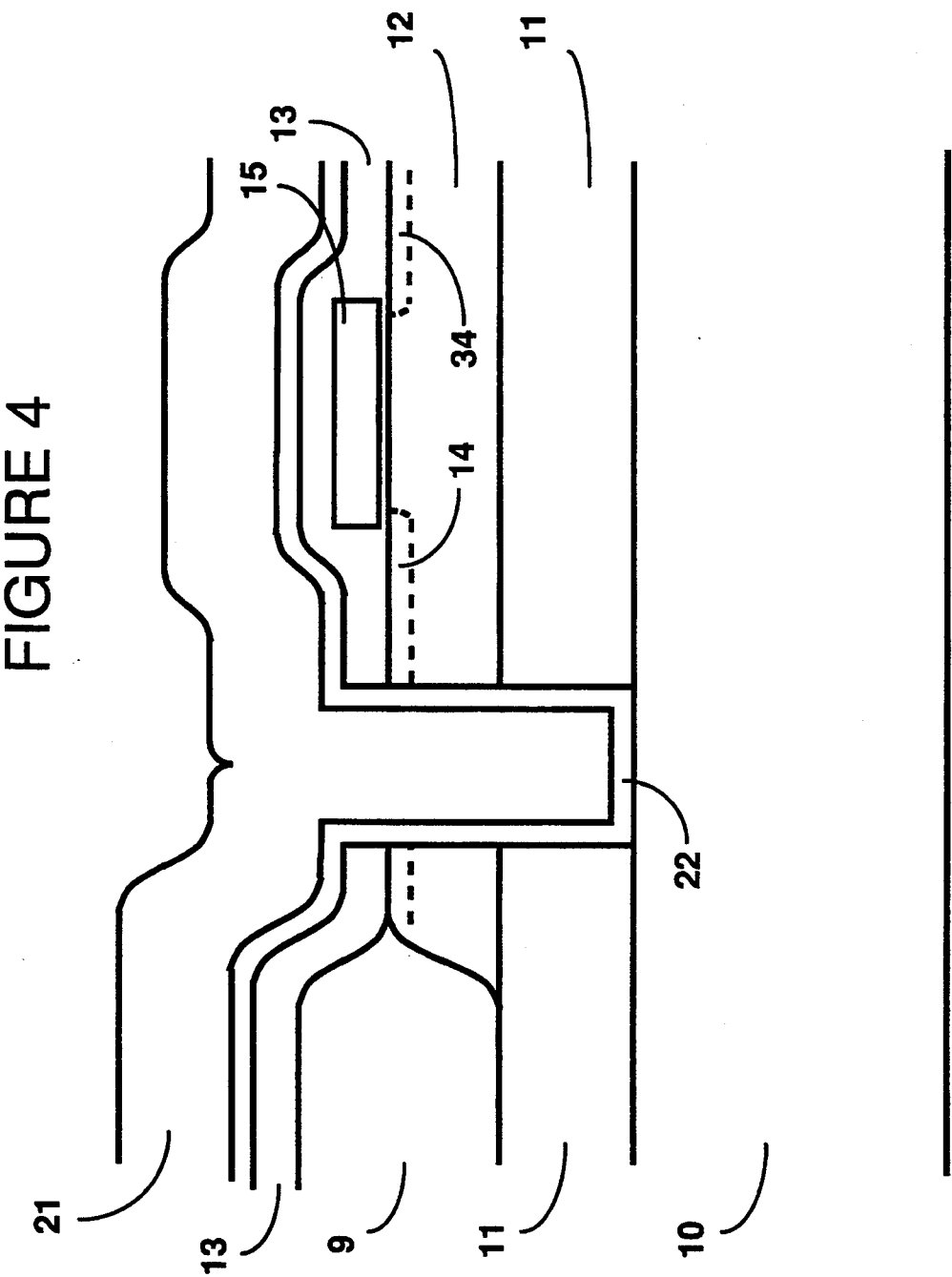

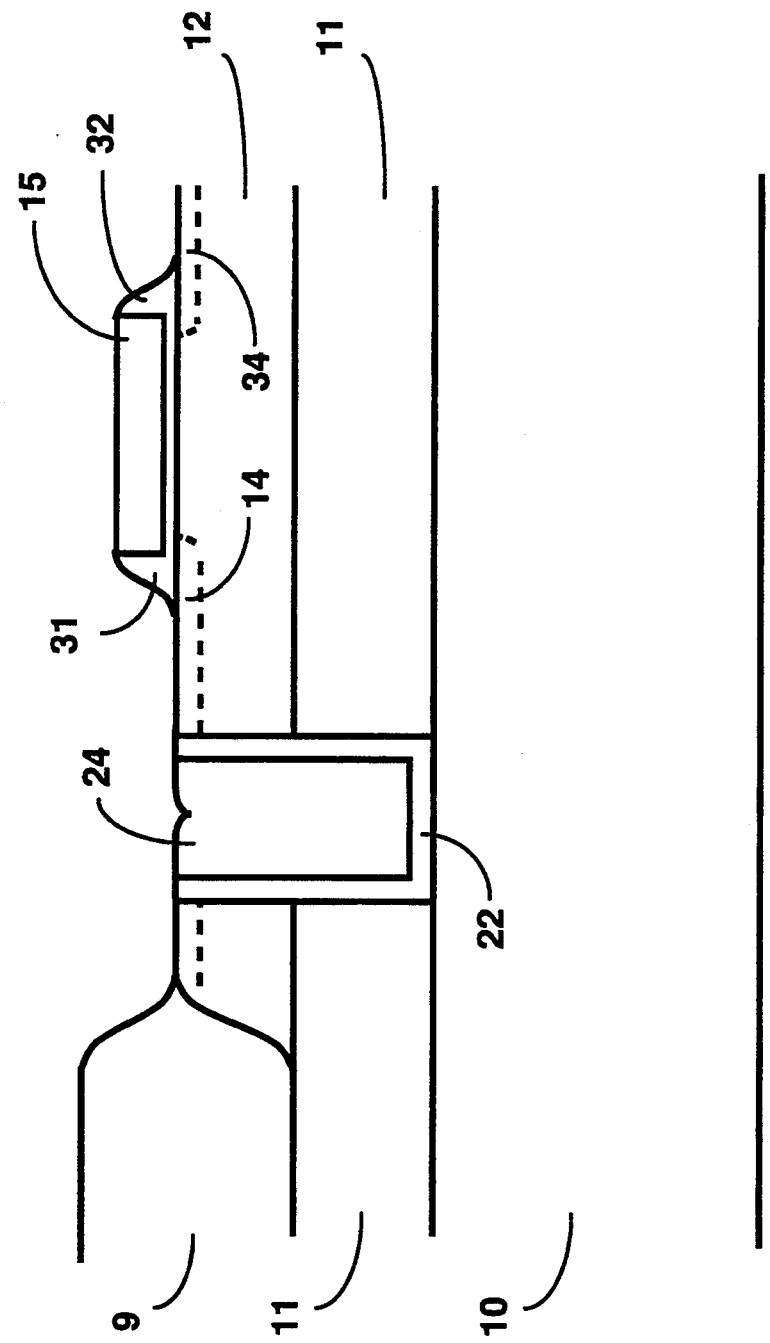

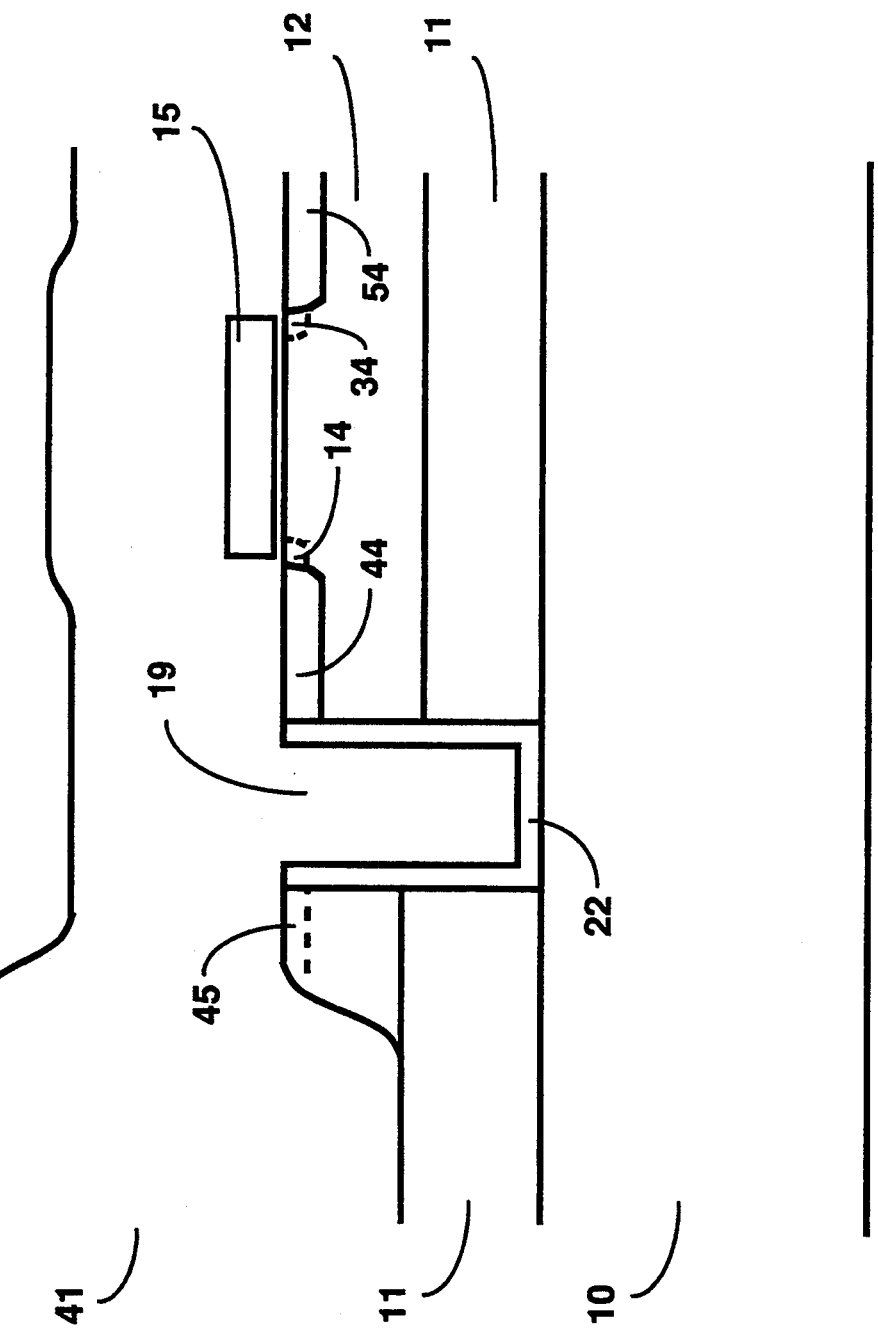

SEMICONDUCTOR ON INSULATOR STATIC RANDOM ACCESS MEORY CELL UTILIZING POLYSILICON RESISTORS FORMED IN TRENCHES

BACKGROUND

This is invention relates generally to static random access memory (SRAM) cells and particularly to semiconductor on insulator (SOI SRAM cells which utilize polysilicon resistors formed in trenches.

Presently, using complementary metal oxide silicon (CMOS) technology, SRAM cells are constructed using either a four transistor or a six transistor implementation. Typically, the four transistor configuration uses a polysilicon load element which functions as a passive resistor. The load resistors are generally situated horizontally over the active cell elements to reduce the cell area. See, for example, T. Ohzone, T. Hirao, K. Tsuji, S. Horiuchi, and S. Takayanagi, A 2Kx8-Bit Static MOS RAM with a New Memory Cell Structure, *IEEE J. Solid-State Circuits*, vol. SC-15, pp. 201–205, April. 1980.

The four transistor configuration has the advantage of a small size. The four transistor configuration has the disadvantage of requiring a more complex process than a six transistor implementation. The four transistor configuration also has the disadvantage of a higher standby current.

The six transistor configuration has the advantage that it can easily be implemented in the standard ASIC CMOS process. However, SRAM cells which utilize the six transistor configuration are larger than SRAM cells which utilize the four transistor configuration and are more susceptible to latch up. Latch up occurs when the four-layer NPNP CMOS structure acts like a silicon controlled rectifier (SCR) and switches from a high impedance state to a low impedance state in response to a triggering signal. This latch up is detrimental and sometimes destructive to the integrated circuit.

SUMMARY OF THE INVENTION

In accordance with the preferred embodiment of the present invention, formation of a resistor is presented. For example, the resistor is connected to the source-/drain of a transistor and used as a load element of a memory cell. A trench is formed which extends from a top of a wafer through an isolation region to a silicon base or substrate. For example, the wafer is a bonded semiconductor on insulator (SOI) wafer. The silicon base of the wafer is located below the isolation region. A resistive layer of material is formed in the trench. The resistive layer extends from the top of the wafer through the isolation region of the wafer and is electrically connected to the silicon base of the wafer. The resistor is connected to other circuitry on the wafer, for example, by implanting into the wafer atoms of a first conductivity type into a region immediately adjacent to the resistive layer of material in the trench. In the preferred embodiment, the resistive layer of material is deposited polysilicon.

The formation of the resistor may be done by adding steps to the normal process flow of forming a transistor. For example, in the formation of a transistor, a gate insulator region is formed on a wafer. A gate is formed on the gate insulator region. In the preferred embodiment of the present invention, low doping concentration source/drain regions are implanted on both sides of the gate. In order to construct a resistor, a trench is formed on a first side of the gate. The trench extends from a top of the wafer through an isolation region of the wafer to a base of the wafer. The base of the wafer is located below the isolation region of the wafer. A resistive layer of material is formed in the trench. The resistive layer is, for example, deposited polysilicon. The resistive layer extends from the top of the wafer through the isolation region of the wafer and is electrically coupled to the base of the wafer. Construction of the transistor is completed by forming highly doped source/drain regions on the sides of the transistor. The source/drain region on the first side of the gate is in electrical contact with the resistive layer formed in the trench. In the preferred embodiment of the present invention, spacers are formed on both sides of the gate before implanting atoms to form the highly doped source-/drain regions.

The resistors described above can be used as load elements for a four transistor SRAM cell. The memory cell includes two load elements, a word line, a bit line, an inverted bit line, a ground line, a power line, a first transistor, a second transistor, a third transistor and a fourth transistor. The power line is connected to the silicon base of the wafer. The first transistor has a first end connected to the inverted bit line, a second end, and a gate connected to the word line. The second transistor has a first end, a second end connected to the bit line, and a gate connected to the word line. The third transistor has a first end connected to the second end of the first transistor, a second end connected to the ground line, and a gate connected to the first end of the second transistor. The fourth transistor has a first end connected to the first end of the second transistor, a second end connected to the ground line, and a gate connected to the second end of the first transistor. The first load element is connected between the second end of the first transistor and the silicon base of the wafer. The second load element is connected between the first end of the second transistor and the silicon base of the wafer.

Use of resistors in accordance with the preferred embodiment of the present invention as load elements in SRAM cells has several significant advantages over the prior art. For example, by using a silicon base as a voltage source allows for the elimination of a separate power bias line in the memory cell. The elimination of the power line in addition to the vertical orientation of the resistor allows reduction in the size of the SRAM cell. Also the preferred embodiment of the present invention eliminates the possibility of contamination of the polysilicon resistor from underlying oxides, as is possible in prior art SRAM cells where a polysilicon resistor is placed on top of an oxide region.

BRIEF DESCRIPTION OF THE DRAWINGS

FIG. 2, FIG. 3, FIG. 4, FIG. 5 and FIG. 6 show processing steps to produce a semiconductor on insulator (SOI) SRAM cell which utilizes polysilicon resistors formed in trenches in accordance with the preferred embodiment of the present invention.

DESCRIPTION OF THE PREFERRED EMBODIMENT

Figure 1:
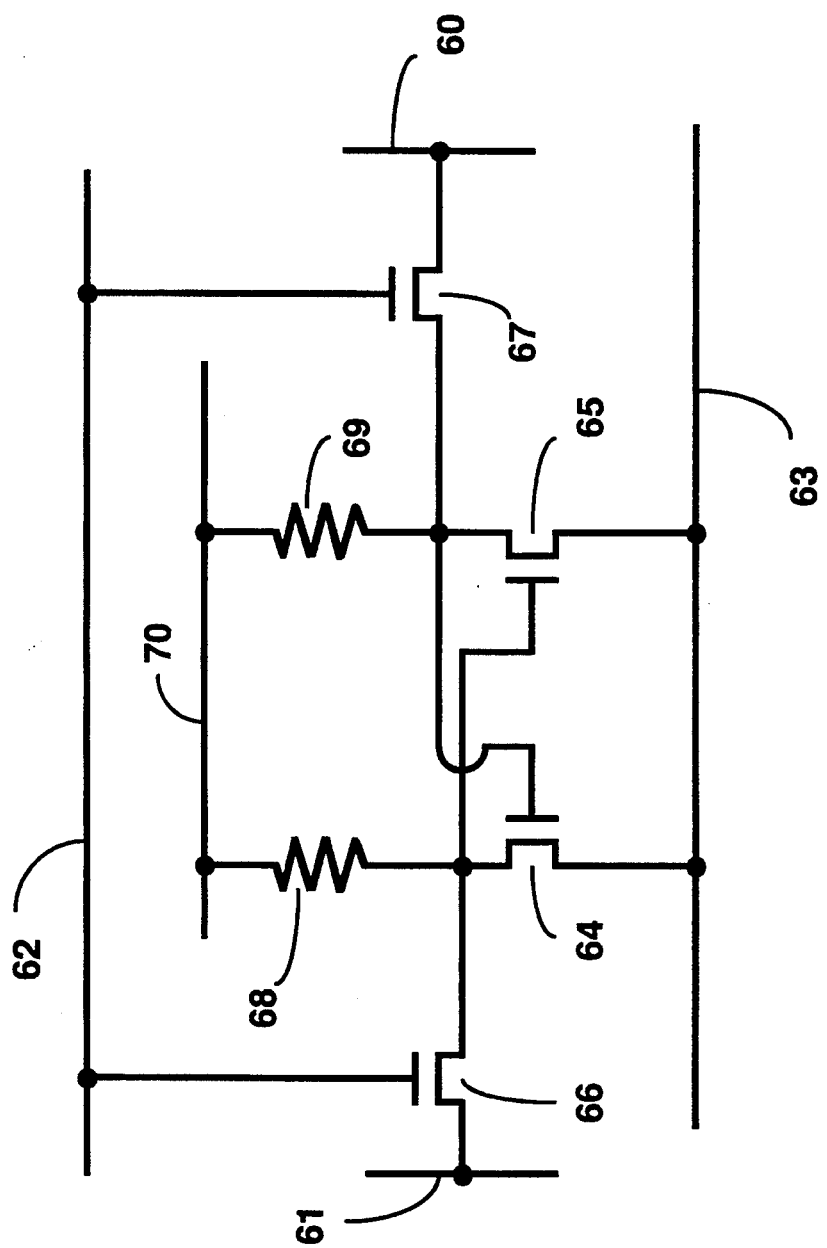
FIG. 1 shows a schematic diagram of an SRAM cell in accordance with the preferred embodiment of the present invention.

FIG. 1 shows a schematic diagram of an SRAM cell according to the preferred embodiment of the present invention. The SRAM cell includes a transistor 64, a transistor 65, a transistor 66 and a transistor 67 connected as shown. Transistor 64, transistor 65, transistor 66 and transistor 67 are each NMOS transistors. A load resistor 68 and a load resistor 69 are used as load devices for the SRAM memory cell. A $V_{cc}$ bias voltage is placed on a $V_{cc}$ bias voltage line 70. The $V_{cc}$ bias voltage is, for example 5 volts. A $V_{ss}$ bias voltage is placed on a $V_{ss}$ bias voltage line 63. The $V_{ss}$ bias voltage is, for example 0 volts. The SRAM cell is accessed using a word line 62, a bit line 60 and an inverted bit line 61.

In order to implement the SRAM cell, the preferred embodiment of the present invention utilizes bonded semiconductor on silicon (SOI) wafer technology. The use of bonded wafers for SOI technology has overcome many of the difficulties encountered with silicon on sapphire technology and the use of SIMOX wafers. See, for example, Laura Peters, SOI Takes Over Where Silicon Leaves Off, *Semiconductor International*, March 1993, pp. 48–51; or, H. H. Hosack, Recent Progess in SOI Materials For the Next Generation of IC Technology, *The Electrochemical Society Interface*, Spring 1993, pp. 51–57. Bonded wafers for SOI processes are available, for example, from Hughes Danbury Optical Systems, Inc. Precision Materials Operations, having a business address of 100 Wooster Heights Road, Danbury, Conn. 06810-7589.

The present invention allows polysilicon resistors to be formed in trenches by adding steps to conventional CMOS processes. FIG. 2, FIG. 3, FIG. 4, FIG. 5 and FIG. 6 show the additional processing steps integrated into a semiconductor on insulator (SOI) process for producing polysilicon SRAM cell load resistors in trenches, in accordance with the preferred embodiment of the present invention. For example, FIG. 2, FIG. 3, FIG. 4, FIG. 5 and FIG. 6 illustrate the formation of transistor 64 and load resistance 68 shown in FIG. 1.

In FIG. 2, a bonded wafer is shown to include a silicon base 10 of a first conductivity type, a silicon dioxide isolation layer 11 and a silicon layer 12 of a second conductivity type. For example, the first conductivity type is n-type and the second conductivity type is p-type.

A standard process flow may be used up to the point in the process shown in FIG. 2. For example, a local oxidation of silicon (LOCOS) process or other process is used to form an insulating layer 9 of, for example, field oxide on silicon layer 12. For example, in a LOCOS process, a layer of pad oxide is thermally grown. On top of the pad oxide, a layer of Silicon Nitride is deposited. The Silicon Nitride is patterned and etched. Field oxide is grown on silicon layer 12 at places where the Silicon Nitride has been etched to expose silicon layer 12. The Silicon Nitride and pad oxide are then removed.

After the isolation is formed, a layer of gate oxide is placed (i.e. grown or deposited) on exposed portions of silicon layer 12. A gate 15 is formed on the gate oxide layer using a deposited layer followed by a mask and etch process. Gate 15 is the gate of transistor 64. Typically, gate 15 has a width which is approximately equal to 0.6 microns. Gate 15 may be made of polysilicon, for example, doped with n-type atoms at $10^{20}$ atoms per cubic centimeter. The n-type atoms may be, for example, Phosphorus or Arsenic. Alternate to forming gate 15 entirely of polysilicon, a polycide may be used. The polycide gate may be formed as follows. A layer of polysilicon is deposited over the layer of gate oxide. For example, the deposition may be a chemical vapor deposition (CVD). The polysilicon is doped using $POCl_3$. Alternately, an implant of Phosphorus or Arsenic atoms may be used. A metal layer is deposited on top of the polysilicon layer. A rapid thermal anneal (or other annealing process) is used to react the metal layer with the polysilicon layer. The metal-silicide layer may be formed, for example, using Titanium (Ti), Molybdenum (Mo), Chromium (Cr), Nickel (Ni), Platinum (Pt), Cobalt (Co), Tungsten (W) or Tantalum (Ta).

On both sides of gate 15 are implanted a region 14 and a region 34, both of first conductivity type. Region 14 and region 34 act as lightly doped source/drain (LDD) regions for transistor 64. For example, regions 14 and 34 are n− regions doped with Phosphorus at $10^{18}$ atoms per cubic centimeter. Regions 14 and 34 each extend approximately 0.1 microns below the surface of silicon layer 12. A spacer oxide region 13 is then deposited to a thickness of, for example 3000 Angstroms.

At this point trenches are formed in which polysilicon resistors will be formed. For example, as shown in FIG. 3, a photoresist layer 16 is deposited over spacer oxide region 13. The photoresist is patterned leaving an opening where a trench will be etched. A trench 19 is formed by reactive ion etching (RIE) through spacer oxide region 13, silicon layer 12 and silicon dioxide isolation layer 11 to expose silicon base 10. The photoresist is then removed.

As shown in FIG. 4, a layer 22 of, for example, polysilicon is deposited. Layer 22 will be used to form load resistor 68. Layer 22 is for example, 0.1 micrometer thick. Layer 22 can be doped in-situ during deposition. Alternately, layer 22 can be doped after deposition, for example, by large tilt angle implants. Alternately, the polysilicon may be left undoped. The doping level will be determined by the memory cell and circuit standby current requirements. After deposition and doping of layer 22, trench 19 is back-filled with an isolation material 21. Isolation material 21 is deposited in a layer which is thick enough to completely fill trench 19. For example, isolation material 21 is silicon dioxide.

RIE etches are used to remove excess isolation material 21, the portion of layer 22 outside of trench 19, and the excess portion of spacer oxide 13. The result is shown in FIG. 5. In FIG. 5, an insulation region 24 of, for example silicon dioxide fills what was once trench 19. A spacer 31 and a spacer 32 are formed on either side of gate 15. Spacer 31 and spacer 32 each extend approximately 0.2 micrometers out from the bottom of gate 15.

The processing steps for forming resistor 68 is complete. The remainder of the processing follows a standard CMOS flow. This includes implantation of the source/drain regions, such as n+ region 44, n+ region 45 and n+ region 54 formed on either side of trench 19 and gate 15, as shown in FIG. 6. A layer 41 of, for example, silicon dioxide is placed over the circuit and filled trench 19, as shown in FIG. 6. Completion of the circuit includes patterning and etching of contact holes and metalization.

Construction of load resistors, such as load resistor 68, in accordance with the preferred embodiment described above has several significant advantages over the prior art. For example, by using silicon base 10, as voltage source 70, to supply the $V_{cc}$ bias voltage allows for the elimination of a separate $V_{cc}$ bias line within the memory cell. Additionally, vertical orientation of the polysilicon resistor allows additional reduction in the size of the SRAM cell. Also the preferred embodiment of the present invention eliminates the possibility of contamination of the polysilicon resistor from underlying oxides, as is possible in prior art embodiments where a polysilicon resistor is placed on top of an oxide region.

The foregoing discussion discloses and describes merely exemplary methods and embodiments of the present invention. As will be understood by those familiar with the art, the invention may be embodied in other specific forms without departing from the spirit or essential characteristics thereof. For example, in the discussion of the preferred embodiment, the SRAM cells utilized NMOS transistors. As will be understood by persons of ordinary skill in the art, the conductivity types could be changed to form SRAM cells still within the contemplated purview of the present invention. Also, the preferred embodiment utilizes SOI technology. However, the invention could also be implemented using wafers produced using Separation by Implantation of Oxygen (SIMOX) technology. Accordingly, the disclosure of the present invention is intended to be illustrative, but not limiting, of the scope of the invention, which is set forth in the following claims.

I claim:

1. An integrated circuit comprising:
   a top layer of semiconductive material extending across a top surface of the integrated circuit;
   an isolation layer of insulating material extending across the integrated circuit immediately under the top surface;
   a silicon base layer of semiconductive material extending across a bottom surface of the integrated circuit; and, a memory cell including
      selection means for selecting the memory cell, and
      a first load element, coupled to the selection means, the first load element comprising a resistive layer of material which extends from the top layer of the integrated circuit through the isolation layer of the integrated circuit and is electrically coupled to the silicon base layer of the integrated circuit.

2. An integrated circuit as in claim 1 wherein the resistive layer of material comprises polysilicon.

3. An integrated circuit as in claim 1 wherein the selection means includes:
   a word line;
   a bit line;
   an inverted bit line;
   a ground line;
   a power line connected to the silicon base of the integrated circuit;
   a first transistor having a first end coupled to the inverted bit line, a second end, and a gate coupled to the word line;
   a second transistor having a first end, a second end coupled to the bit line, and a gate coupled to the word line;
   a third transistor having a first end coupled to the second end of the first transistor, a second end coupled to the ground line, and a gate coupled to the first end of the second transistor; and,
   a fourth transistor having a first end coupled to the first end of the second transistor, a second end coupled to the ground line, and a gate coupled to the second end of the first transistor.

4. An integrated circuit comprising:
   a top layer of semiconductive material extending across a top surface of the integrated circuit;
   an isolation layer of insulating material extending across the integrated circuit immediately under the top surface;
   a silicon base layer of semiconductive material extending across a bottom surface of the integrated circuit; and,
   a resistor including a resistive layer of material in a trench, the trench extending from the top layer of the integrated circuit through the isolation layer of the integrated circuit to the silicon base layer of the integrated circuit, wherein the resistive layer extends from the top layer of the integrated circuit through the isolation layer of the integrated circuit and is electrically coupled to the silicon base layer of the integrated circuit.

5. An integrated circuit as in claim 4 wherein the integrated circuit additionally comprises additional circuitry, the resistor being connected to the additional circuitry by a region immediately adjacent to the resistive layer of material in the trench, atoms of a first conductivity type being implanted into the region immediately adjacent to the resistive layer of material in the trench.

6. An integrated circuit as in claim 4 wherein the resistive layer of material is deposited polysilicon.

* * * * *